US010991797B2

(12) United States Patent
Zhang et al.

(10) Patent No.: US 10,991,797 B2
(45) Date of Patent: Apr. 27, 2021

(54) SELF-ALIGNED TWO-DIMENSIONAL MATERIAL TRANSISTORS

(71) Applicant: International Business Machines Corporation, Armonk, NY (US)

(72) Inventors: Chen Zhang, Guilderland, NY (US); Peng Xu, Santa Clara, CA (US); Chun Wing Yeung, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/351,801

(22) Filed: Mar. 13, 2019

(65) Prior Publication Data

US 2020/0295132 A1    Sep. 17, 2020

(51) Int. Cl.
| H01L 29/06 | (2006.01) |
| H01L 29/786 | (2006.01) |
| H01L 29/10 | (2006.01) |
| H01L 29/66 | (2006.01) |

(52) U.S. Cl.
CPC ...... *H01L 29/0665* (2013.01); *H01L 29/1033* (2013.01); *H01L 29/66742* (2013.01); *H01L 29/78696* (2013.01)

(58) Field of Classification Search
USPC ..... 257/192, 76, 20, E21.395, E21.399, 194, 257/285, 197, E29.246–E29.253; 438/172, 168, 129, 156, 198, 285
See application file for complete search history.

(56) References Cited

U.S. PATENT DOCUMENTS

| 7,772,059 | B2 | 8/2010 | Parikh et al. | |
| 9,318,555 | B2 | 4/2016 | Lin et al. | |
| 9,583,574 | B2* | 2/2017 | Dasgupta | H01L 29/7783 |
| 9,859,115 | B2 | 1/2018 | Lin et al. | |
| 2005/0167775 | A1* | 8/2005 | Nagy | H01L 29/7787 257/500 |
| 2014/0167064 | A1* | 6/2014 | Hurkx | H01L 29/475 257/76 |
| 2016/0141427 | A1 | 5/2016 | Chen et al. | |
| 2018/0151751 | A1* | 5/2018 | Yeh | H01L 21/31116 |
| 2019/0058042 | A1* | 2/2019 | Then | H01L 29/2003 |

FOREIGN PATENT DOCUMENTS

CN      105957807      9/2016

* cited by examiner

*Primary Examiner* — Niki H Nguyen
(74) *Attorney, Agent, or Firm* — Fleit Intellectual Property Law; Thomas S. Grzesik

(57) ABSTRACT

A semiconductor device and method for forming the same. The device comprises at least a dielectric layer, a two-dimensional (2D) material layer, a gate structure, and source/drain contacts. The 2D material layer contacts the dielectric layer. The gate structure contacts the 2D material layer. The source/drain contacts are disposed above the 2D material layer and contact the gate structure. The method includes forming a structure including at least a handle wafer, a 2D material layer, a gate structure in contact with the 2D material layer, an insulating layer, and a sacrificial layer. A portion of the sacrificial layer is etched. An inter-layer dielectric is formed in contact with the insulating layer and sidewalls of the sacrificial layer. The sacrificial layer and a portion of the insulating layer are removed. Source and drain contacts are formed in contact with the portion of the 2D material layer.

14 Claims, 15 Drawing Sheets

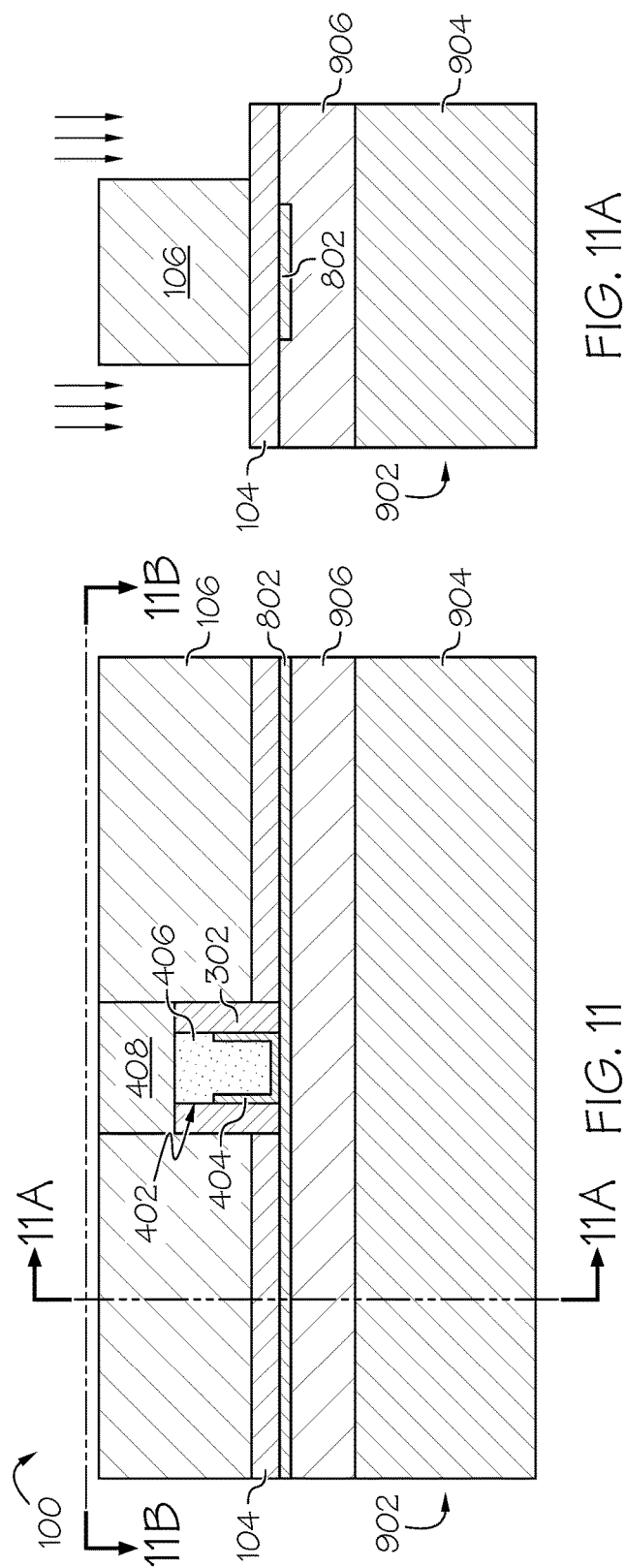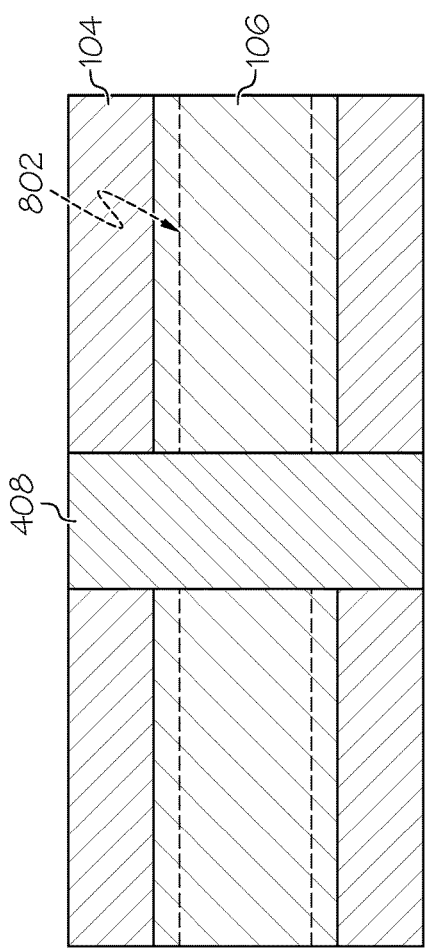
FIG. 11A
FIG. 11
FIG. 11B

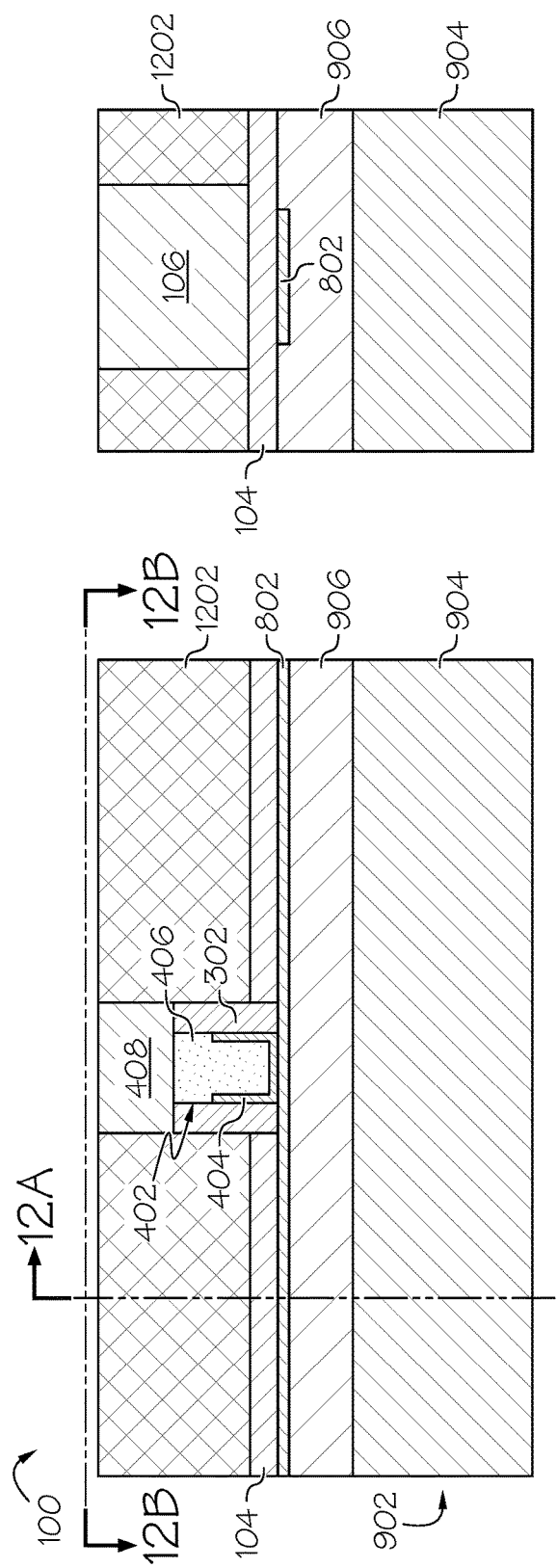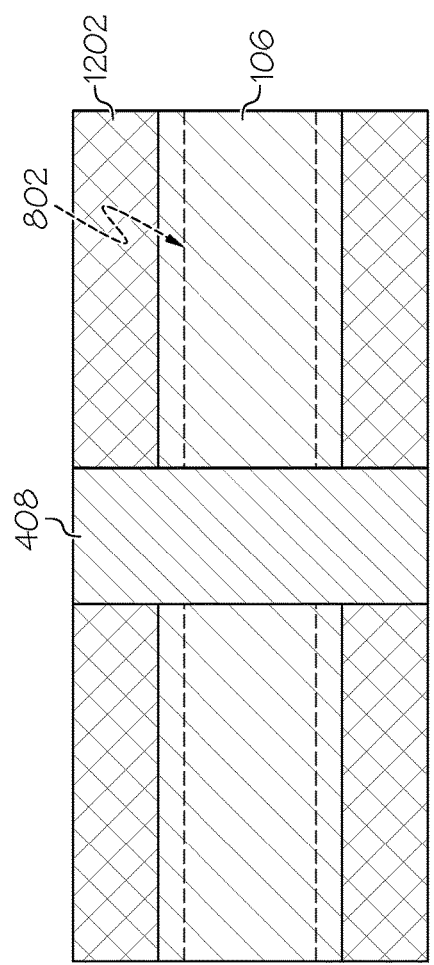

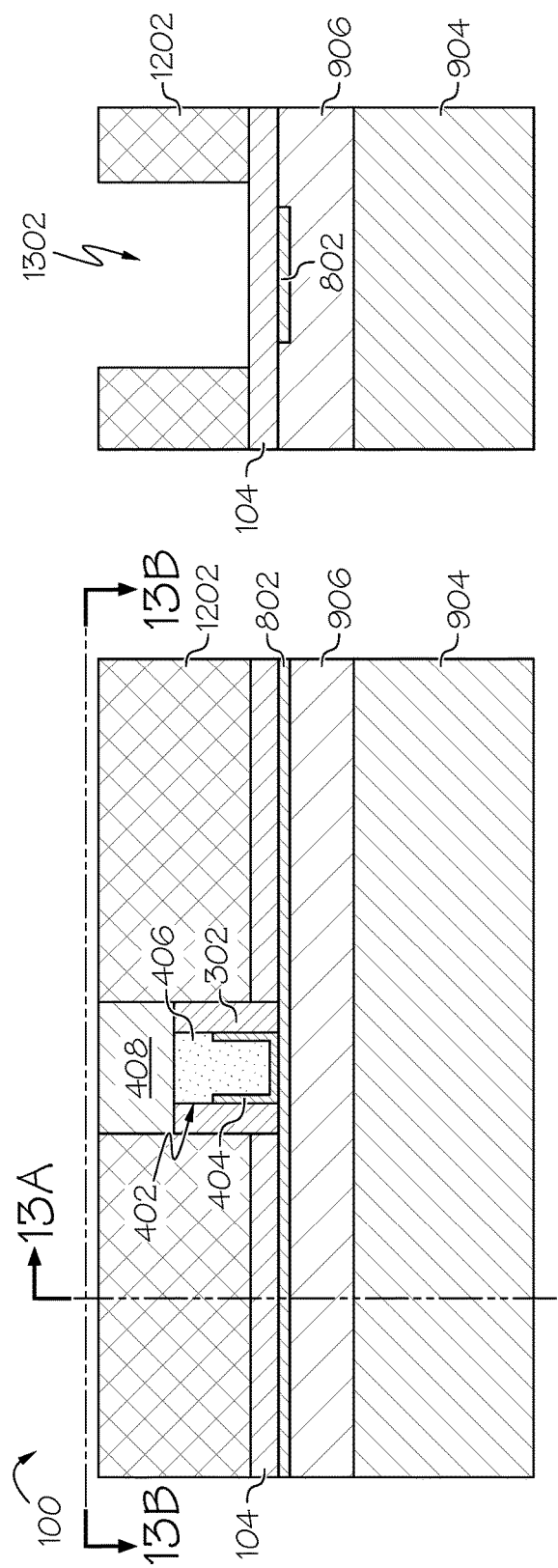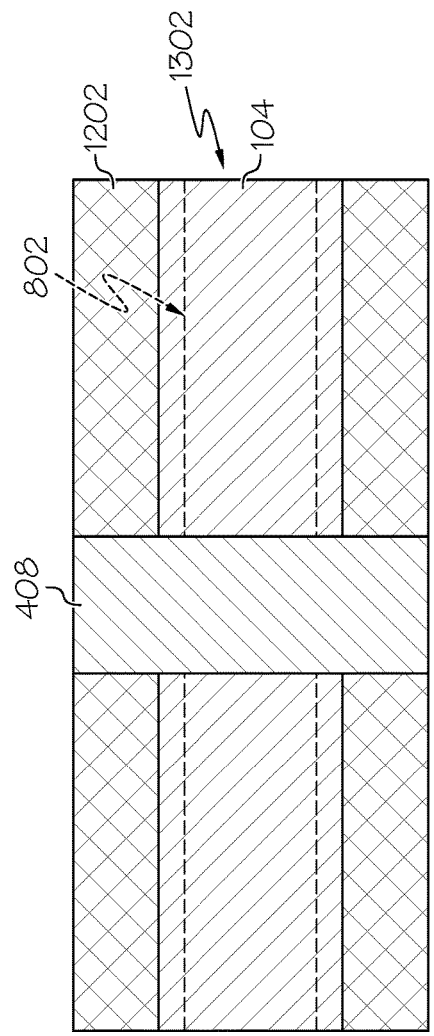

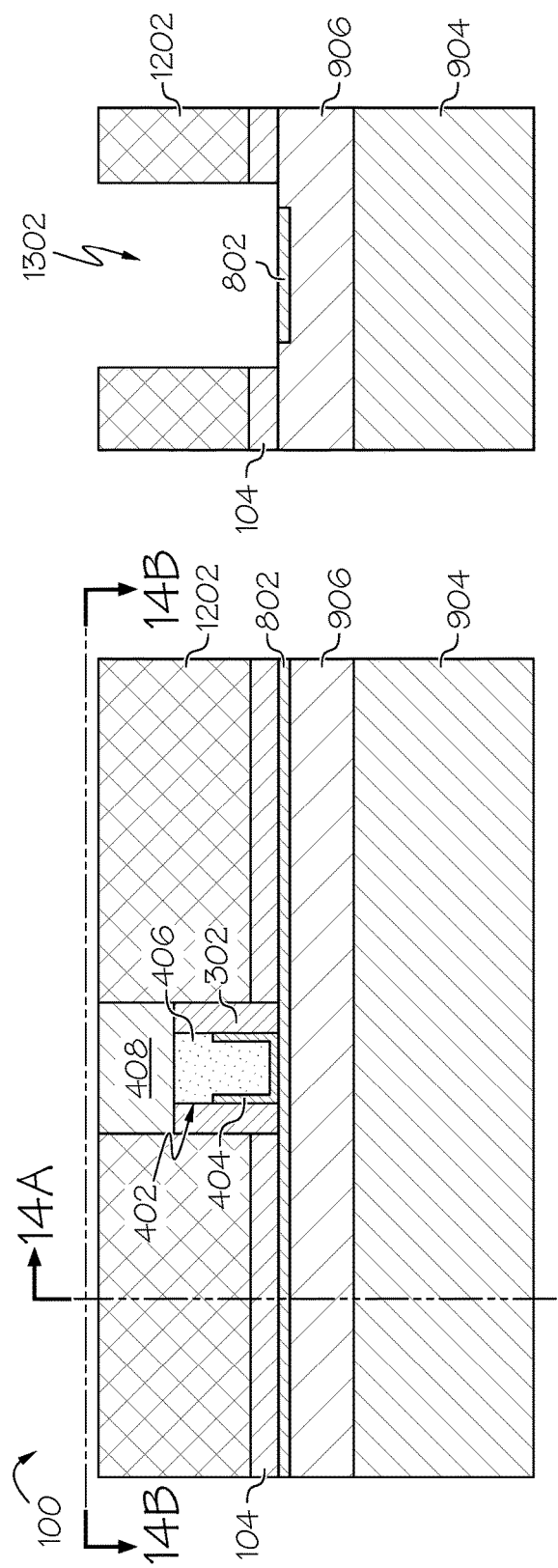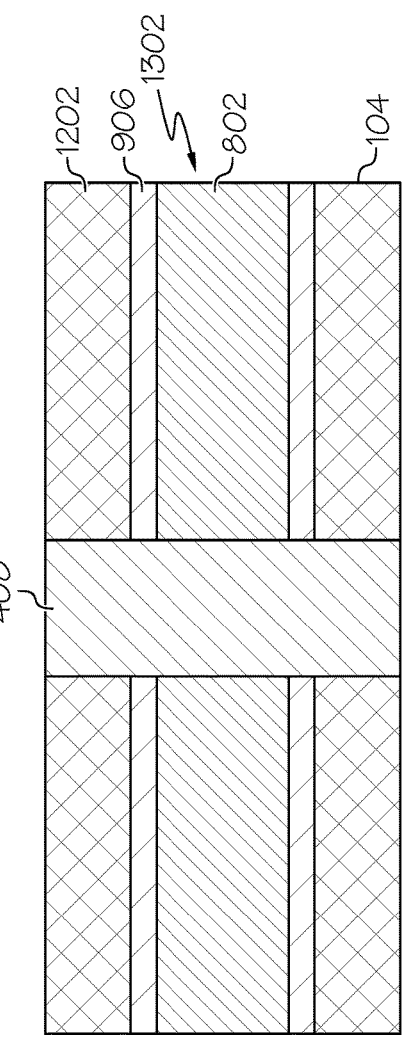

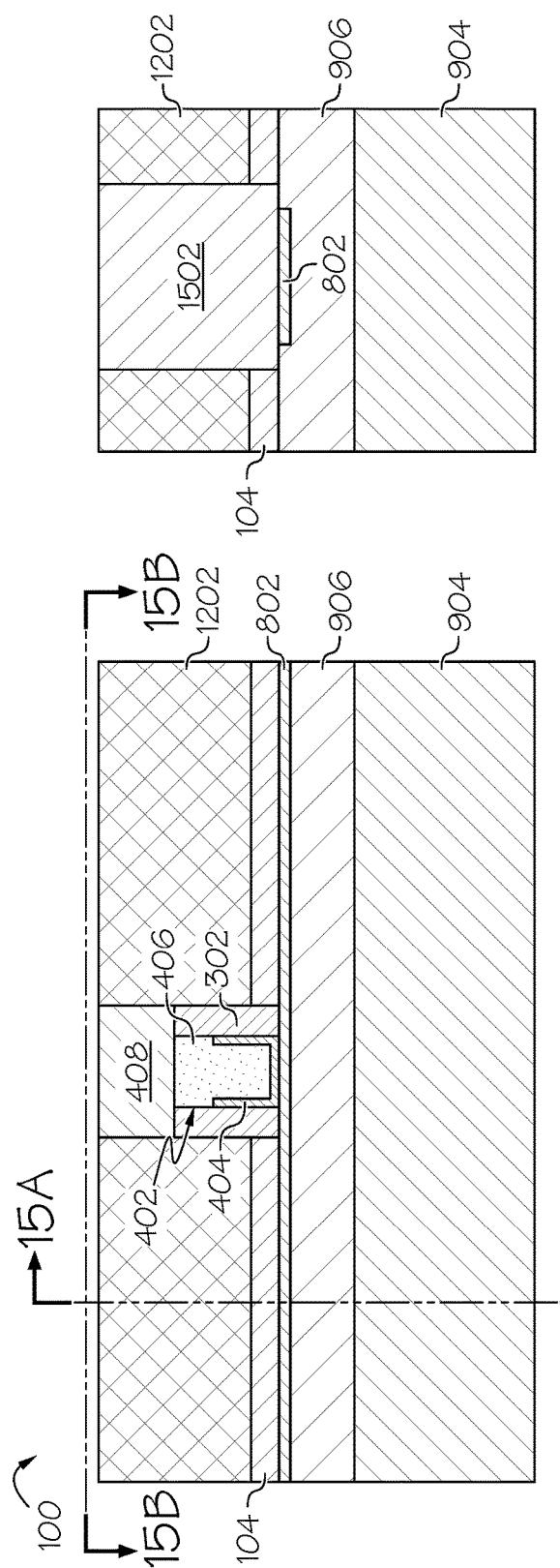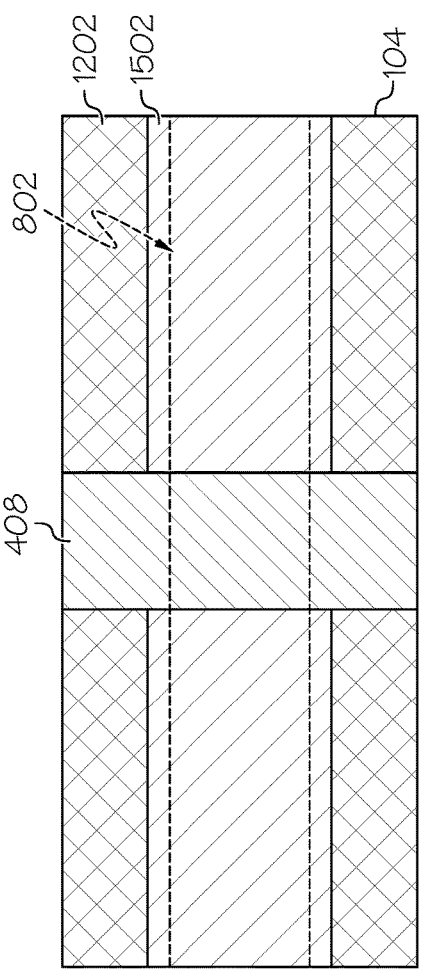

SELF-ALIGNED TWO-DIMENSIONAL MATERIAL TRANSISTORS

BACKGROUND OF THE INVENTION

The present disclosure generally relates to the field of semiconductors, and more particularly relates to semiconductor structures comprising two-dimensional materials.

Two-dimensional (2D) materials are crystalline materials having a single layer of atoms. 2D materials have gained interest for use in semiconductor fabrication due to their enhanced electrical properties over non-2D materials and their potential for higher device densities, decreased features sizes, etc.

SUMMARY OF THE INVENTION

In one embodiment, a method of forming a semiconductor device is disclosed. The method comprises forming a structure comprising at least a handle wafer, a two-dimensional (2D) material layer, a gate structure formed on and in contact with the 2D material layer, an insulating layer in contact with the 2D material layer and the gate structure, and a sacrificial layer in contact with the insulating layer and the gate structure. A portion of the sacrificial layer is etched thereby exposing a first portion of the insulating layer. An inter-layer dielectric is formed on the first portion of the insulating layer and sidewalls of the sacrificial layer. The sacrificial layer and a second portion of the insulating layer are removed thereby exposing a portion of the 2D material layer. A source contact layer and a drain contact layer are formed in contact with the portion of the 2D material layer.

In another embodiment, a method of forming a semiconductor device is disclosed. The method comprises forming a structure comprising a substrate, an insulating layer in contact with the substrate, a sacrificial layer in contact with the insulating layer, and a gate structure in the sacrificial and insulating layers. The structure is flipped and bonded to a first handle wafer. The substrate is removed and a two-dimensional material (2D) layer is formed in contact with the insulating layer and the gate structure. The structure is flipped after the 2D material layer has been formed, and bonded the structure to a second handle wafer. The first handled wafer is then removed.

In a further embodiment, semiconductor device is disclosed. The semiconductor device comprises at least a dielectric layer, a two-dimensional (2D) material layer, a gate structure, a source contact layer, and a drain contact layer. The 2D material is disposed on and in contact with the dielectric layer. The gate structure is disposed on and in contact with the 2D material layer. The source contact layer is disposed above the 2D material layer and in contact with the gate structure. The drain contact layer is disposed above the 2D material layer and in contact with the gate structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 11 is a cross-sectional view of the structure after a portion of the sacrificial polysilicon layer has been etched according to one embodiment of the present invention;

FIG. 11A is another cross-sectional view of the structure after the portion of the sacrificial polysilicon layer has been etched according to one embodiment of the present invention;

FIG. 11B is a plain view of the structure shown in FIG. 11 according to one embodiment of the present invention;

FIG. 12 is a cross-sectional view of the structure after an inter-layer dielectric has been deposited according to one embodiment of the present invention;

FIG. 12A is another cross-sectional view of the structure after the inter-layer dielectric has been deposited according to one embodiment of the present invention;

FIG. 12B is a plain view of the structure shown in FIG. 12 according to one embodiment of the present invention;

FIG. 13 is a cross-sectional view of the structure after the sacrificial polysilicon layer has been removed according to one embodiment of the present invention;

FIG. 13A is another cross-sectional view of the structure after the sacrificial polysilicon layer has been removed according to one embodiment of the present invention;

FIG. 13B is a plain view of the structure shown in FIG. 13 according to one embodiment of the present invention;

FIG. 14 is a cross-sectional view of the structure after exposed portions of the silicon oxide layer have been removed according to one embodiment of the present invention;

FIG. 14A is another cross-sectional view of the structure after the exposed portions of the silicon oxide layer have been removed according to one embodiment of the present invention;

FIG. 14B is a plain view of the structure shown in FIG. 14 according to one embodiment of the present invention;

FIG. 15 is a cross-sectional view of the structure after source/drain contacts have been formed according to one embodiment of the present invention;

FIG. 15A is another cross-sectional view of the structure after the source/drain contacts have been formed according to one embodiment of the present invention;

FIG. 15B is a plain view of the structure shown in FIG. 15 according to one embodiment of the present invention;

DETAILED DESCRIPTION

Figure 1:
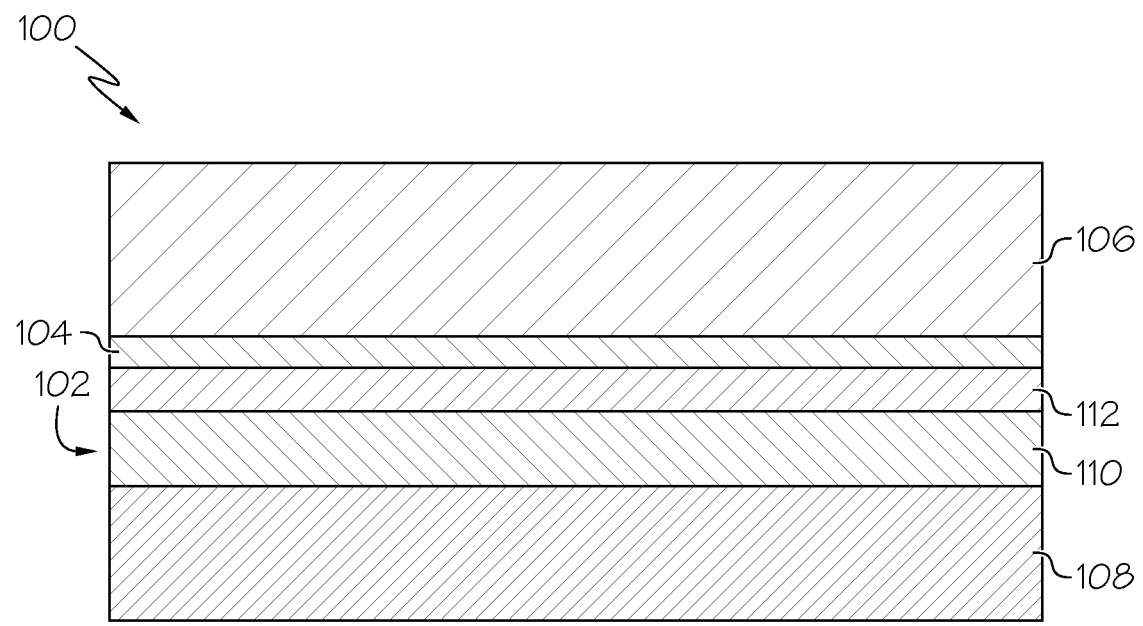
FIG. 1 is a cross-sectional view of an initial structure comprising a silicon-on-insulator (SOI) substrate having a silicon oxide layer and sacrificial polysilicon layer formed thereon according to one embodiment of the present invention.

It is to be understood that the present disclosure will be described in terms of a given illustrative architecture; however, other architectures, structures, substrate materials, process features, and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip that may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As noted above, 2D materials are crystalline materials having a single layer of atoms. 2D materials have gained interest for use in semiconductor fabrication. However, 2D materials present various problems during the semiconductor fabrication process. For example, it is difficult to directly deposit a high-k material on 2D materials because there are no dangling bonds on a defect-free 2D material surface. A plasma precursor could be used, but the plasma damages the 2D material causing mobility degradation. Also, common CMOS processes such as reactive ion etching (RIE) are generally not compatible with 2D materials since they are easily damaged by, for example, high-energy plasma. Even further, conventional fabrication processes for 2D-based transistor generally utilize a back-gate structure. These fabrication processes are problematic since they do not provide any self-alignment of the features, which leads to a high parasitic capacitance. As will be discussed in greater detail below, embodiments of the present invention overcome the above problems by forming a self-aligned gate on a dummy/sacrificial substrate and then replacing the substrate with a 2-D material.

FIGS. 1-15B illustrate various processes and structures for fabrication a self-aligned 2D material transistor. FIG. 1 shows an initial structure 100 comprising a silicon-on-insulator (SOI) substrate 102, a silicon oxide (SiO2) layer 104, and a sacrificial/dummy polysilicon layer 106. In one embodiment, the SOI substrate 102 comprises a substrate layer 108 comprising, for example, silicon (Si); a buried oxide (BOX) layer 110 comprising, for example, SiO2; and an SOI layer 112 comprising, for example, silicon. It should be noted that the layers of the SOI substrate 102 is not limited to these materials and other materials are applicable as well. It should also be noted that embodiments are not limited to an SOI substrate as other substrates are applicable as well.

Figure 2:
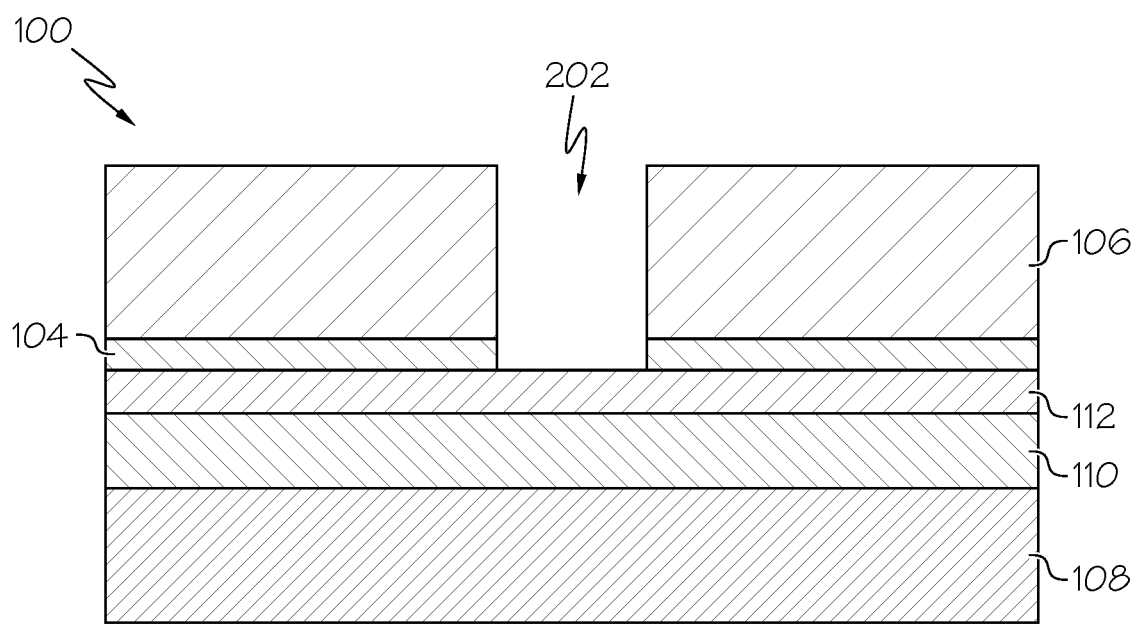
FIG. 2 is a cross-sectional view of the structure after a trench has been formed in a portion of the sacrificial polysilicon layer and silicon oxide layer according to one embodiment of the present invention.

The SiO2 layer 104 may be formed on and in contact with the top silicon layer 112 of the SOI substrate, and may be formed using chemical vapor deposition (CVD), thermal oxidation, and/or the like. The SiO2 layer 104 may be used to protect subsequently formed/deposited 2D material layers as will be discussed in greater detail below. The sacrificial polysilicon layer 106 may be formed on and in contact with the SiO2 layer 104 using CVD or any other application deposition process. A gate cavity (trench) 202 may then be formed through the polysilicon layer 106 and the SiO2 layer 104, as shown in FIG. 2. The gate cavity 202 exposes the top surface of a portion of the top SOI layer 112. The gate cavity 202 may be formed using one or more photolithographic patterning techniques through which a pattern is formed in a patterning stack and subsequently transferred down into the polysilicon layer 106 and the SiO2 layer 104 using a process such as RIE.

Figure 3:
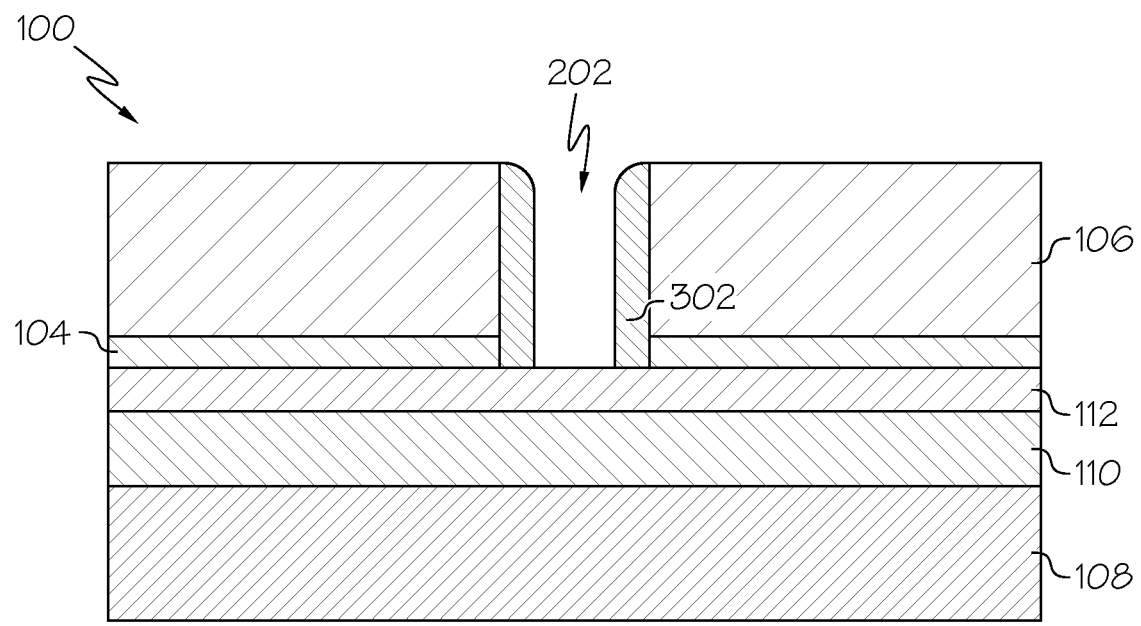
FIG. 3 is a cross-sectional view of the structure after a spacer/liner has been formed on sidewalls of the trench according to one embodiment of the present invention.
Figure 4:
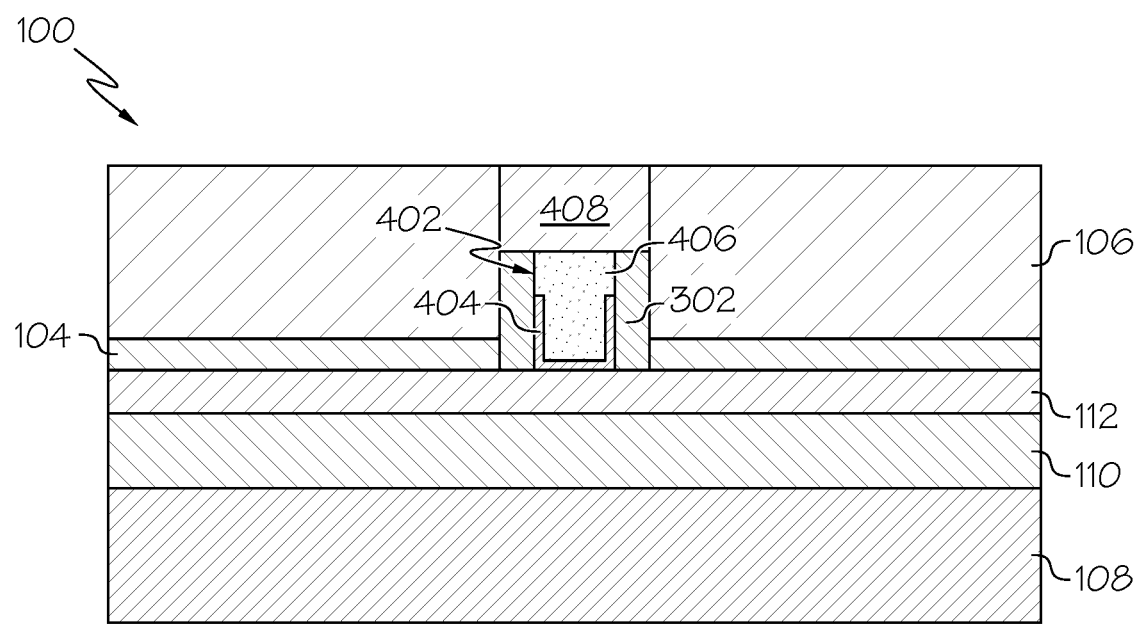
FIG. 4 is a cross-sectional view of the structure after a gate has been formed within the trench according to one embodiment of the present invention.

FIG. 3 shows that a spacer/liner 302 is formed on the sidewalls of the gate cavity 202. In one embodiment, the spacer 302 may be formed by depositing a conformal layer of spacer material such as, but not limited to, silicon nitride (SiN), over the structure followed by an anisotropic ion etch that removes the conformal layer from all horizontal surfaces (those surfaces normal or about normal to the etchant ion stream). The anisotropic etch leaves an inner spacer 302 on sidewalls of the gate cavity 202. A gate structure 402 is then formed within the gate cavity 202, as shown in FIG. 4. For example, FIG. 4 shows a result of a deposition of a high dielectric constant (high-k) gate insulator layer 404 followed by deposition of a gate conductor 406.

The gate structure 402 may be formed by blanket depositing a high high-k gate dielectric material on the bottom and vertical sidewalls of the spacer 302 within the gate cavity 202. The high-k dielectric material may be a dielectric metal oxide having a dielectric constant greater than 8.0. The dielectric metal oxide may be deposited by a process such as CVD, physical vapor deposition (PVD), molecular beam deposition (MBD), pulsed laser deposition (PLD), liquid source misted chemical deposition (LSMCD), atomic layer deposition (ALD), etc. Examples of high-k materials include, but are not limited to high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer 1102, 1104 may further include dopants such as lanthanum or aluminum.

The portions of the high-k gate dielectric material above the top surface of the sacrificial polysilicon layer 106 may be removed by chemical mechanical planarization (CMP), recess etch, or a combination thereof. In some embodiments, portions of the high-k gate dielectric material within the gate cavity may be selectively etch to recess the high-k layer 404 below a top surface of the cavity 202. A gate conductor material may then be deposited in the gate cavity to form the gate conductor 406. Any excess gate conductor material outside of the gate cavity may be removed by CMP, recess etch, or a combination thereof. Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

In some embodiments, the top surface of the high-k layer 404 and the gate conductor layer 406 are coplanar. However, in other embodiments the top surface of the high-k layer 404 is below a top surface of the gate conductor layer 406 such that a portion of the gate conductor layer 406 is formed on top of and in contact with the top surface of the high-k layer 404. In addition, the conductive gate material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack. In some embodiments, the full metal stack of the gate structure 402 may include both work function layers and an additional layer such as tungsten on top of the work function layers.

The gate conductor layer 406 may be recessed below a top surface of the sacrificial polysilicon layer 106. In some embodiments the spacer 302 may also be recessed during this process. A wet or dry etch may be used to etch the gate conductor layer 406. A capping material such as, but not limited to, silicon nitride, may then be deposited over the structure such that it fills the recess within the gate cavity. Excess capping material may then be removed by, for example, CMP, such that a top surface of the material is co-planar with a top surface of the sacrificial polysilicon layer 106. This process forms a cap 408 above the gate structure 402 and in contract with a top surface of the spacer 302 and the gate conductor layer 406. In some embodiments, the spacer 302 and/or cap 408 are considered part of the gate structure 402. It should be noted that embodiments of the present invention are not limited to the process for forming the gate layers or the materials discussed above. Other processes and materials may be utilized to form the gate structure 402.

Figure 5:
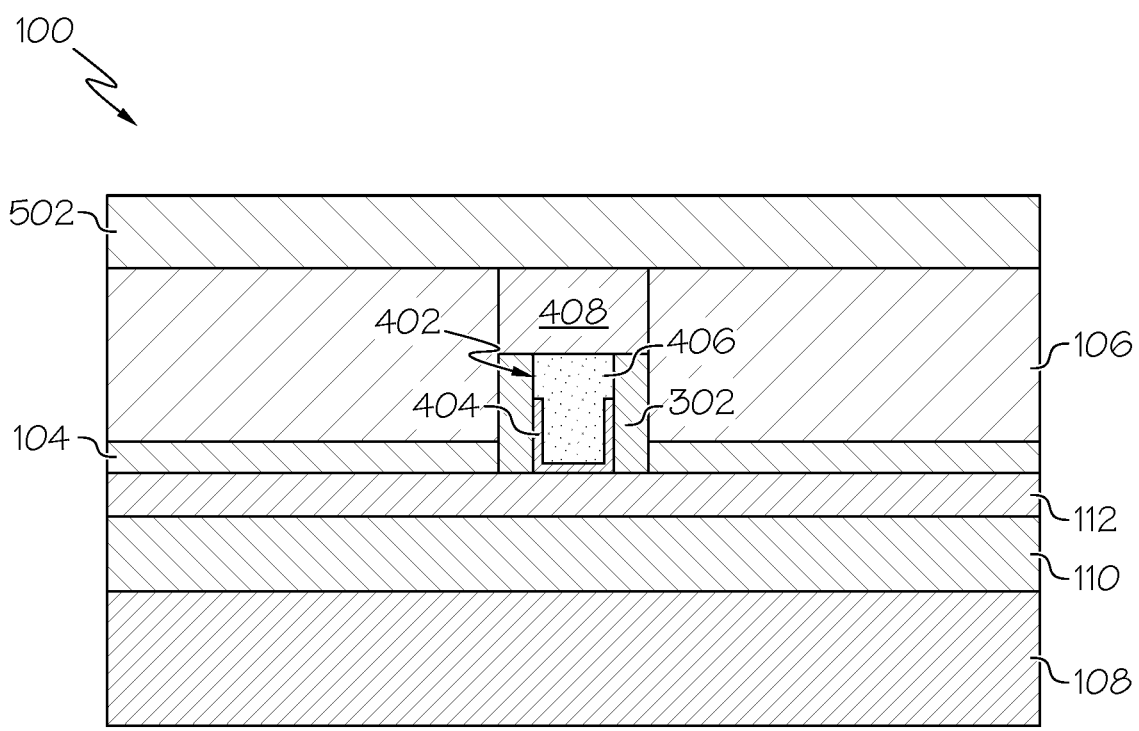
FIG. 5 is a cross-sectional view of the structure after a dielectric layer has been formed on the sacrificial polysilicon layer and gate according to one embodiment of the present invention.
Figure 6:
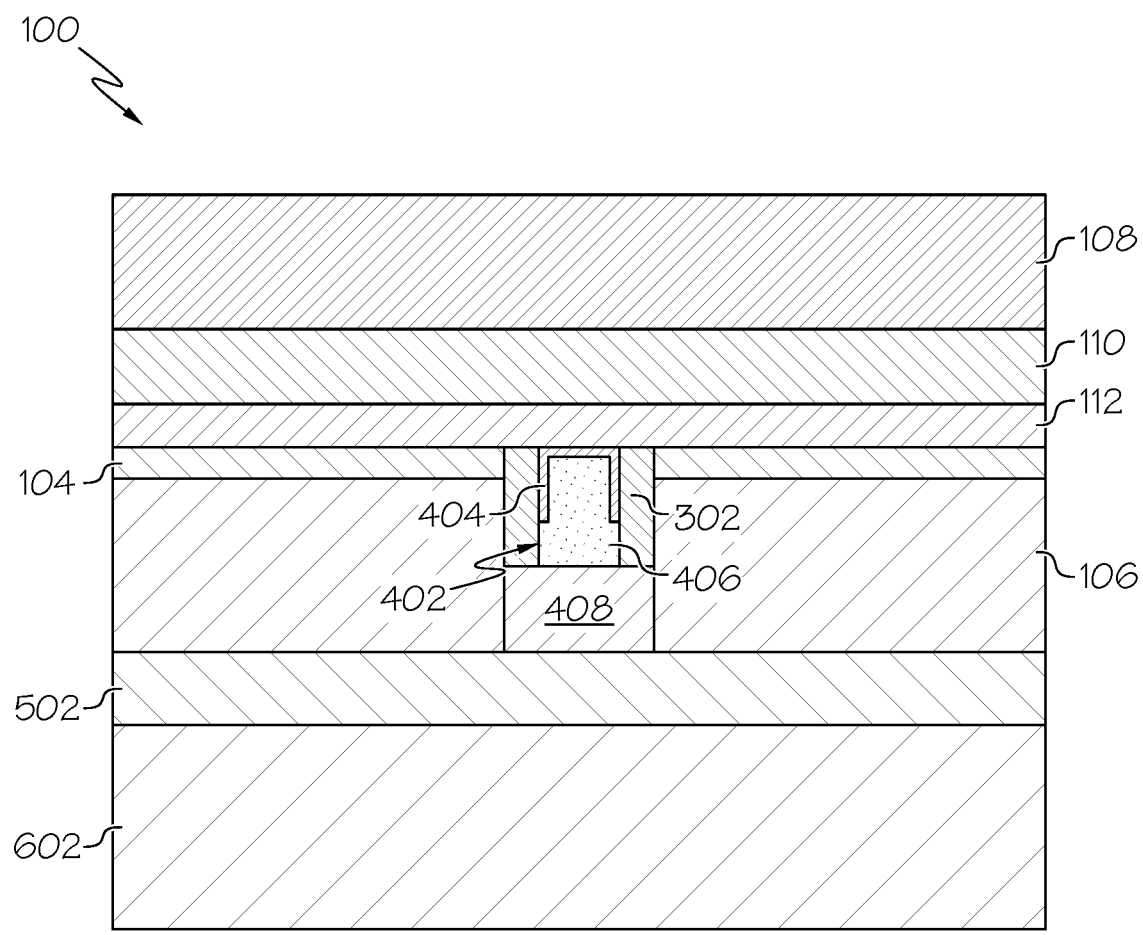
FIG. 6 is a cross-sectional view of the structure has been flipped/rotated and bonded to a first handle wafer according to one embodiment of the present invention.

FIG. 5 shows that a dielectric layer 502 comprising, for example, silicon oxide may be formed on and in contact with a top surface of the sacrificial polysilicon layer 106 and the gate cap 408. The dielectric layer may be formed by CVD, thermal oxidation, and/or the like. The structure 100 is then flipped/rotated and bonded to a new handle wafer 602, as shown in FIG. 6. After rotation and bonding, the bottom surface of the original substrate 108 becomes the top surface of the structure 100 and the top surface of the dielectric layer 502 (in the previous orientation) has been bonded to the top surface of the new substrate/wafer 602. Any bonding technique may be utilized to bond the dielectric layer 502 to the new substrate 602. The new substrate 602 may be single crystalline and or a bulk substrate, a semiconductor-on-insulator (SOI) substrate, or a hybrid substrate.

Figure 7:
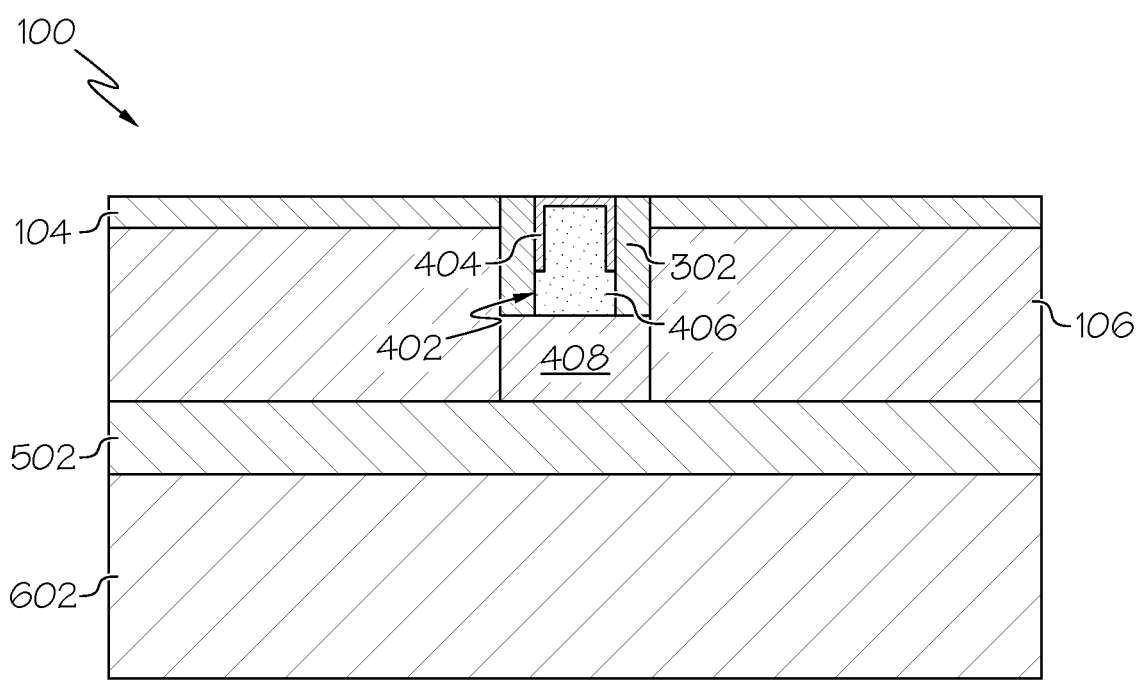
FIG. 7 is a cross-sectional view of the structure has been after the original SOI substrate has been removed according to one embodiment of the present invention.

Once the structure of FIG. 5 has been bonded to the new substrate 602, the original substrate 102 may be removed as shown in FIG. 7. Various processes may be utilized to remove the original substrate 102. For example, the substrate layer 108 may be removed using ammonia and the BOX layer 110 may be removed using HF-based chemicals. The SOI layer 112 of the original substrate 102 may be selectively removed using tetramethylammonium hydroxide and/or the like. The removal of the substrate 102 exposes a surface of the SiO2 layer 104, a surface of the spacer 302, and a surface of the high-k layer 404. These exposed surfaces were previously the bottom surfaces of these layers prior to the structure being flipped/rotated and are now referred to as top surfaces in the structure's current orientation.

Figure 8:
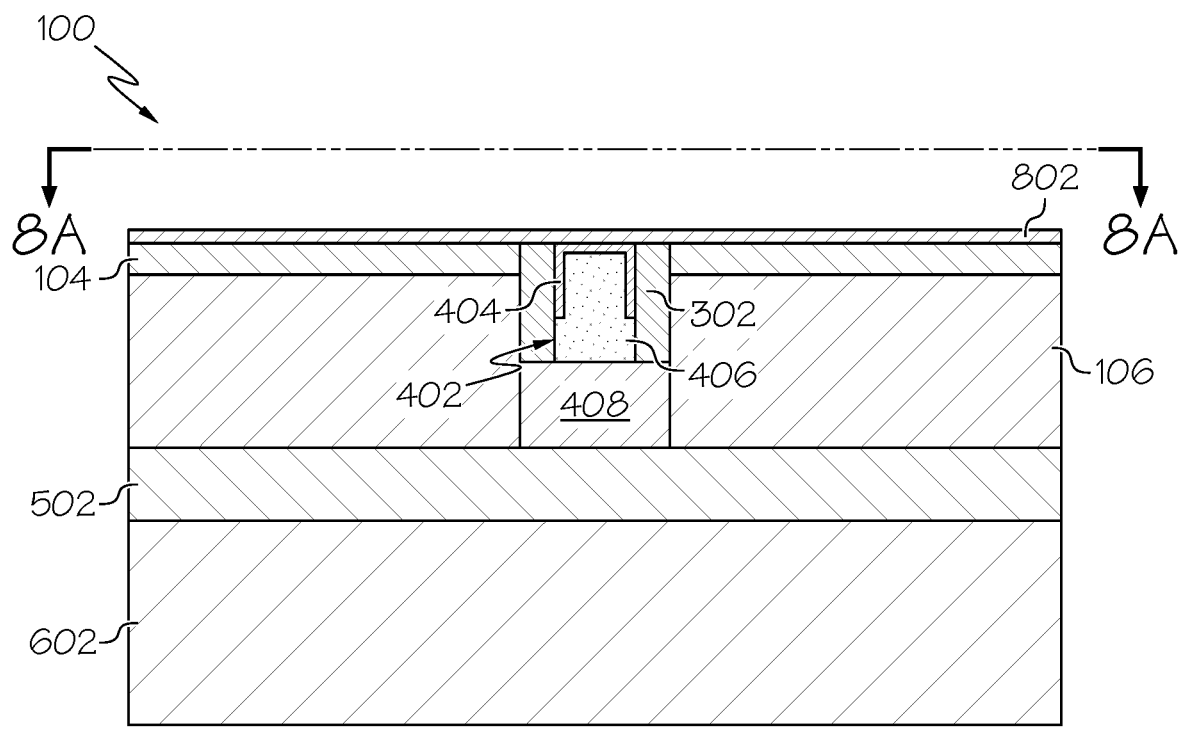
FIG. 8 is a cross-sectional view of the structure after one or more 2D materials have been formed/deposited on the structure according to one embodiment of the present invention.

One or more 2D materials 802 may then be formed or transferred onto and in contact with the exposed surfaces of the SiO2 layer 104, the spacer 302, and the high-k layer 404 as shown in FIG. 8. As discussed above, a 2D material is a crystalline material having a single layer of atoms. 2D materials have strong bonds in two dimensions and weak bonds in a third dimension. Examples of 2D materials include (but are not limited to) graphene and other -ene materials, graphane and other -ane or -ide compounds, transition metal dichalcogenides (TMDCs) including molybdenum disulfide (MoS2), and/or the like. The 2D material layer 802 may be formed using any suitable deposition method such as plasma-enhanced CVD (PECVD), ALD, CVD, molecular beam epitaxy (MBE), epitaxial growth, metal deposition with chemical reaction, a Langmuir-Blodgett process, and/or the like.

Figure 8A:
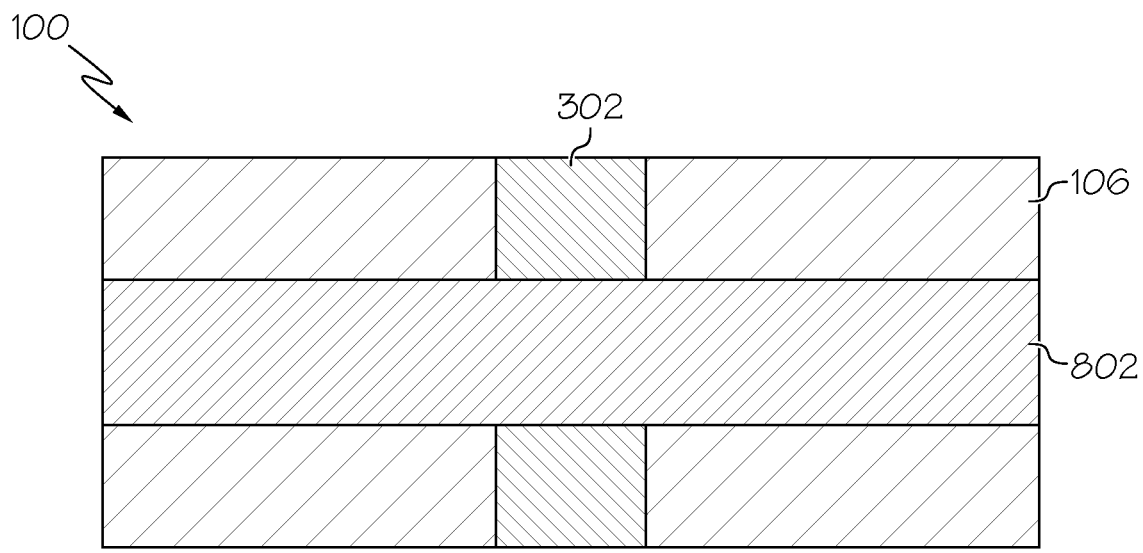
FIG. 8A is a plain view of the structure shown FIG. 8 according to one embodiment of the present invention.

The 2D material layer 802 may be etched to define the width of the channel, as shown in the top-down view of FIG. 8A. For example, a patterning stack or layer may be formed over the 2D material layer 802 and patterned using one or more photolithographic patterning techniques. The pattern may then be transferred to the 2D material layer 802 using one or more etching processes such as RIE for defining the channel width.

Figure 9:
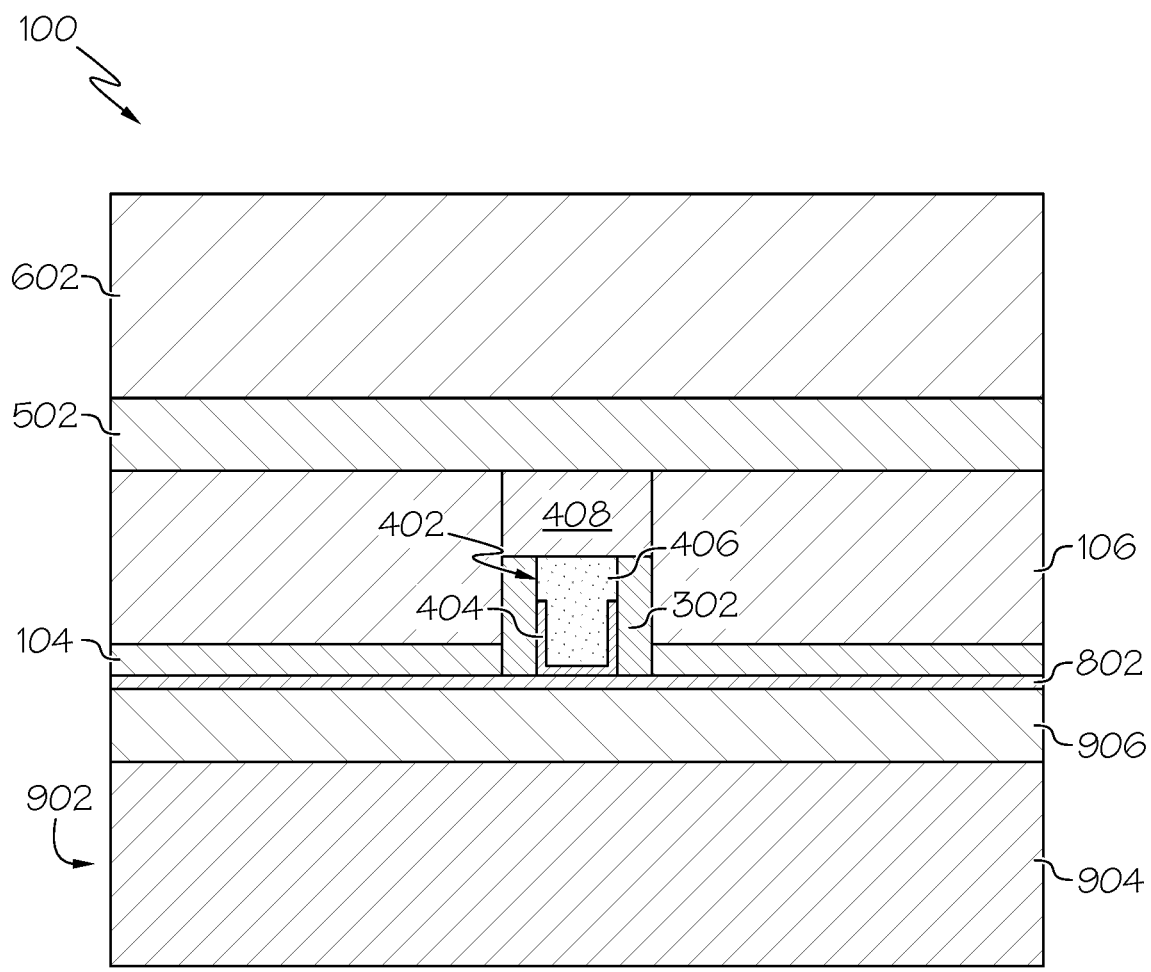
FIG. 9 is a cross-sectional view of the structure has been flipped/rotated and bonded to a second handle wafer according to one embodiment of the present invention.

The structure of FIG. 8 is then flipped or rotated and bonded to a final handle wafer 902, as shown in FIG. 9. The structure 100 is now orientated in the same direction as it was in FIGS. 1-5 (i.e., prior to the initial flipping/rotating operation). In one embodiment, the final wafer/substrate 902 comprise a bottom layer of silicon 904 and a top layer of SiO2 906. However, other insulating materials may be used to form the final handle wafer 902. The SiO2 layer 906 may be formed by any suitable process such as CVD or thermal oxidation. The structure of FIG. 8 is bonded to the final wafer/substrate 902 such that a bottom surface of the 2D material layer 802 (in the orientation shown in FIG. 9) contacts a top surface of the SiO2 layer 906 of the final handle wafer 902. One example of bonding wafer includes pressing the wafers together and utilizing a thermal treatment to enhance the bonding.

Figure 10:
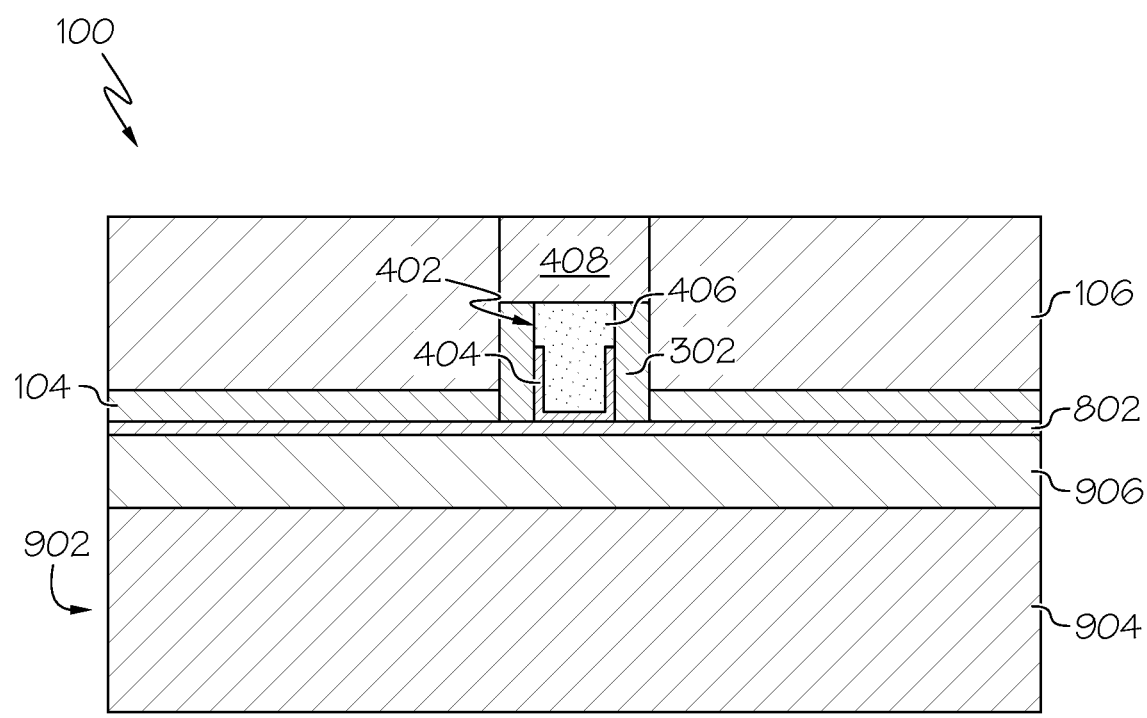
FIG. 10 is a cross-sectional view of the structure after the first handle wafer has been removed according to one embodiment of the present invention.

FIG. 10 shows that after the structure has been bonded to the final wafer/substrate 902, the first handle wafer 602 may then be removed by, for example, one or more etching, grinding, and/or polishing processes. The removal of the first handle wafer 602 exposes the top surface (in the orientation shown in FIG. 10) of the sacrificial polysilicon layer 106 and the top surface of the cap layer 408. The sacrificial polysilicon layer 106 is then etched to define a width for subsequent metal contacts as shown in FIGS. 11 to 11B. The sacrificial polysilicon layer 106 may be etched by, for example, forming a patterning stack/layer over the sacrificial polysilicon layer 106 and the cap layer 408, and forming a pattern in the stack/layer using one or more lithographic processes. The pattern may then be transferred down to the sacrificial polysilicon layer 106 using one or more etching processes. This process exposes a portion of the SiO2 layer 104 situated under and in contact with the sacrificial polysilicon layer 106 as shown in FIGS. 11A and 11B.

An inter-layer dielectric (ILD) 1202 may then be deposited over the structure 100 and planarized as shown in FIGS. 12 to 12B. The ILD 1202 is deposited/formed in contact with the exposed top surface of the SiO2 layer 104; exposed portions of the outer sidewalls of the spacer 302; exposed portions of the sidewalls of the cap layer 408; and sidewalls of the sacrificial/dummy polysilicon layer 106. In one embodiment, a top surface of the ILD 1202 may be co-planar with the top surface of the cap layer 408 and the sacrificial/dummy polysilicon layer 106.

One or more etching processes such as RIE are then performed to remove the sacrificial/dummy polysilicon layer 106 as shown in FIGS. 13 to 13B. The etching process forms a trench 1302 and stops on the SiO2 layer 104. Exposed portions of the SiO2 layer 104 within the trench 1302 are then removed as shown in FIGS. 14 to 14B. In one embodiment, a wet etching process such as a hydrofluoric acid (HF) etch may be utilized to remove the exposed portions of the SiO2 layer 104. The HF etch is compatible with the 2D material(s) layer 802. It should be noted that other etching processes compatible with 2D materials may also be utilized as well. In at least some embodiments the exposed portions of the SiO2 layer 104 are thin, which allows a lateral etch of these portions to be controlled. The removal of the exposed portions of SiO2 layer 104 exposes portions of the underlying 2D material 802.

After the exposed portions of the SiO2 layer 104 have been removed, one or more metal contact layers 1502 (also referred to herein as "source/drain contacts 1502") may be formed as shown in FIGS. 15 to 15B. Since the gate 402 is a self-aligned gate it acts as mask that establishes the source/drain. The contact layers 1502 may be formed such that a bottom surface of the contact 1502 contacts the top surface of a portion of the SiO2 layer 906; the top surface of the 2D material 802; inner sidewalls of the SiO2 layer 104; inner sidewalls of the ILD 1202; outer sidewalls of the spacer 302; and outer sidewalls of the cap layer 408. The contact layer(s) 1502 may be formed by CVD, PVD, ALD, or any combination thereof. The contact layer(s) 1502 may comprise titanium (Ti), tantalum (Ta), hafnium (Hf), zirconium (Zr), niobium (Nb), alloys comprising carbon, and/or the like. However, other materials are applicable as well. After the contact layers 1502 have been formed/deposited, a CMP process may be performed to remove any excess materials and planarize the contact layers 1502. In one embodiment, the top surface contact layers 1502 may be co-planar with the top surface of the ILD 1202 and the top surface of the cap layer 408.

Figure 16:
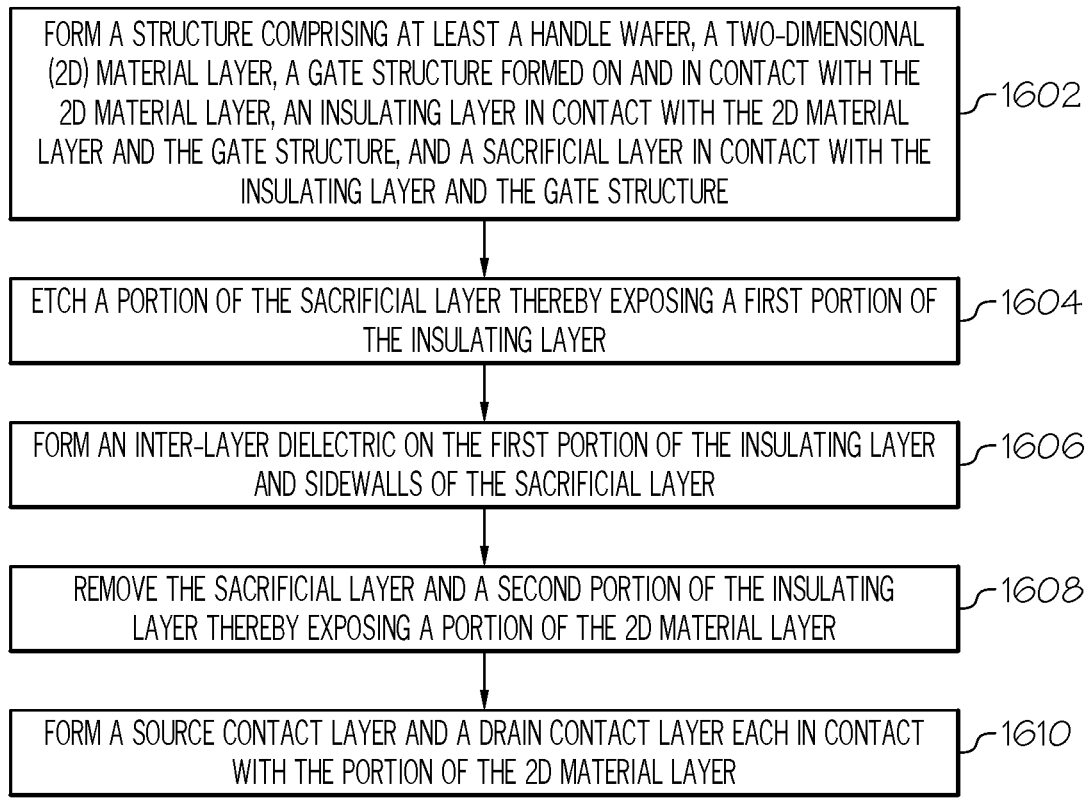
FIG. 16 is an operational flow diagram illustrating one example of a process for fabricating a self-aligned 2D material transistor according to one embodiment of the present invention.

FIG. 16 is an operational flow diagram illustrating one example of a process for fabricating a self-aligned 2D material transistor. It should be noted that each of the steps shown in FIG. 11 has been discussed in greater detail above with respect to FIGS. 1 to 15B. A structure is formed at step 1602. The structure comprises at least a handle wafer, a two-dimensional (2D) material layer, a gate structure formed on and in contact with the 2D material layer, an insulating layer in contact with the 2D material layer and the gate structure, and a sacrificial layer in contact with the insulating layer and the gate structure. A portion of the sacrificial layer is etched thereby exposing a first portion of the insulating layer, at step 1604. An inter inter-layer dielectric is formed on the first portion of the insulating layer and sidewalls of the sacrificial layer, at step 1606. The sacrificial layer and a second portion of the insulating layer are removed thereby exposing a portion of the 2D material layer, at step 1608. A source contact layer and a drain contact layer are formed in contact with the portion of the 2D material layer, at step 1610.

Figure 17:
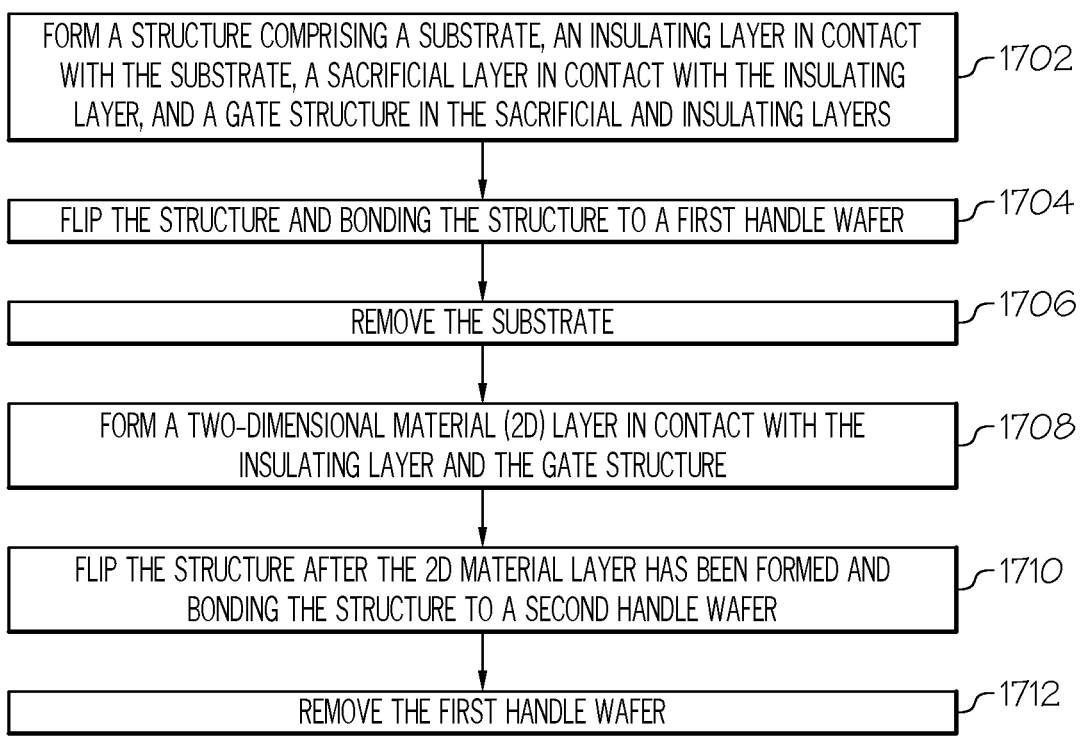
FIG. 17 is an operational flow diagram illustrating another example of a process for fabricating a self-aligned 2D material transistor according to one embodiment of the present invention.

FIG. 17 is an operational flow diagram illustrating another example of a process for fabricating a self-aligned 2D material transistor. It should be noted that each of the steps shown in FIG. 11 has been discussed in greater detail above with respect to FIGS. 1 to 15B. A structure is formed, at step 1702. The structure comprises at least a substrate, an insulating layer in contact with the substrate, a sacrificial layer in contact with the insulating layer, and a gate structure in the sacrificial and insulating layers. The structure is flipped and bonded to a first handle wafer, at step 1704. The substrate is then removed, at step 1706. A two-dimensional material (2D) layer is formed in contact with the insulating layer and the gate structure, a step 1708. The structure is flipped after the 2D material layer has been formed and is then bonded to a second handle wafer, at step 1710. The first handle wafer is removed, at step 1712.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method of forming a semiconductor device, the method comprising:
   forming a structure comprising at least a handle wafer, a two-dimensional (2D) material layer, a gate structure formed on and in contact with the 2D material layer, an insulating layer in contact with the 2D material layer and the gate structure, and a sacrificial layer in contact with the insulating layer and the gate structure;
   etching a portion of the sacrificial layer thereby exposing a first portion of the insulating layer;
   forming an inter-layer dielectric on the first portion of the insulating layer and sidewalls of the sacrificial layer;
   removing the sacrificial layer and a second portion of the insulating layer thereby exposing a portion of the 2D material layer; and
   forming a source contact layer and a drain contact layer each in contact with the portion of the 2D material layer.

2. The method of claim 1, wherein forming the structure comprises:
   forming the insulating layer on a top surface of a substrate; and
   forming the sacrificial layer on and in contact with the insulating layer.

3. The method of claim 2, wherein forming the structure further comprises:
   forming a trench in the sacrificial layer and the insulating layer thereby exposing a portion of the substrate; and
   forming the gate structure within the trench and in contact with the exposed portion of the substrate.

4. The method of claim 3, wherein forming the gate structure comprises at least:
   forming a spacer layer on sidewalls of the trench;
   forming a gate dielectric layer in the trench in contact with the exposed portion of the substrate and the spacer layer;
   forming a gate conductor layer in contact with at least the gate dielectric layer; and
   forming a capping layer in contact with the spacer layer and the gate conductor layer.

5. The method of claim 3, wherein forming the structure further comprises:
   forming a dielectric layer on and in contact with the sacrificial layer and capping laying;
   flipping the structure after forming the dielectric layer; and
   bonding, after the structure has been flipped, to an intermediary handle wafer.

6. The method of claim 5, wherein forming the structure further comprises:
   removing the substrate after the structure has been bonded to the intermediary handle wafer; and
   forming the 2D material layer in contact with the insulating layer and gate structure.

7. The method of claim 6, wherein forming the structure further comprises:
   flipping the structure after forming the 2D material layer;
   bonding the structure to the handle wafer after the structure has been flipped; and
   removing the intermediary handle wafer.

8. A method of forming a semiconductor device structure, the method comprising:
   forming a structure comprising at least a substrate, an insulating layer in contact with the substrate, a sacrificial layer in contact with the insulating layer, and a gate structure in the sacrificial and insulating layers;
   flipping the structure and bonding the structure to a first handle wafer;
   removing the substrate;
   forming a two-dimensional material (2D) layer in contact with the insulating layer and the gate structure;
   flipping the structure after the 2D material layer has been formed and bonding the structure to a second handle wafer; and
   removing the first handle wafer.

9. The method of claim 8, further comprising:
   etching a portion of the sacrificial layer thereby exposing a first portion of the insulating layer; and
   forming an inter-layer dielectric on the first portion of the insulating layer and sidewalls of the sacrificial layer.

10. The method of claim 9, further comprising:
    removing the sacrificial layer and a second portion of the insulating layer thereby exposing a portion of the 2D material layer; and
    forming a source contact layer and a drain contact layer each in contact with the portion of the 2D material layer.

11. The method of claim 8, wherein forming the structure comprises:
    forming the insulating layer on a top surface of a substrate; and
    forming the sacrificial layer on and in contact with the insulating layer.

12. The method of claim 11, wherein forming the structure further comprises:
    forming a trench in the sacrificial layer and the insulating layer thereby exposing a portion of the substrate; and forming the gate structure within the trench and in contact with the exposed portion of the substrate.

13. The method of claim 12, wherein forming the gate structure comprises at least:
   forming a spacer layer on sidewalls of the trench;
   forming a gate dielectric layer in the trench in contact with the exposed portion of the substrate and the spacer layer;
   forming a gate conductor layer in contact with at least the gate dielectric layer; and
   forming a capping layer in contact with the spacer layer and the gate conductor layer.

14. The method of claim 13, further comprising:
   forming a dielectric layer on and in contact with the sacrificial layer and capping laying prior to flipping the structure and bonding the structure to the first handle wafer.

* * * * *